United States Patent
Ma et al.

(10) Patent No.: US 12,040,140 B2
(45) Date of Patent: Jul. 16, 2024

(54) COATINGS FOR ELECTRONIC DEVICES, SOLAR CELLS, COMPOSITE MATERIALS, AND METHODS

(71) Applicant: The Florida State University Research Foundation, Inc., Tallahassee, FL (US)

(72) Inventors: Biwu Ma, Tallahassee, FL (US); Qingquan He, Tallahassee, FL (US)

(73) Assignee: The Florida State University Research Foundation, Inc., Tallahassee, FL (US)

( * ) Notice: Subject to any disclaimer, the term of this patent is extended or adjusted under 35 U.S.C. 154(b) by 0 days.

(21) Appl. No.: 17/684,991

(22) Filed: Mar. 2, 2022

(65) Prior Publication Data
US 2023/0027415 A1    Jan. 26, 2023

Related U.S. Application Data

(60) Provisional application No. 63/155,418, filed on Mar. 2, 2021.

(51) Int. Cl.
  *H10K 30/88*  (2023.01)
  *H01G 9/00*   (2006.01)
  *H01G 9/20*   (2006.01)
  *H10K 85/30*  (2023.01)
  *H10K 85/60*  (2023.01)

(52) U.S. Cl.
  CPC ......... *H01G 9/2009* (2013.01); *H01G 9/0036* (2013.01); *H10K 30/88* (2023.02); *H10K 85/30* (2023.02); *H10K 85/655* (2023.02); *H10K 85/657* (2023.02); *H10K 85/6572* (2023.02)

(58) Field of Classification Search
  CPC ...... H01L 31/00–078; Y02E 10/50–60; H10K 30/00–89
  USPC .................................................. 136/243–265
  See application file for complete search history.

(56) References Cited

U.S. PATENT DOCUMENTS

| | | |
|---|---|---|
| 10,224,459 B2 | 3/2019 | Gao et al. |
| 10,230,049 B2 | 3/2019 | Ma et al. |
| 10,774,032 B2 | 9/2020 | Gao et al. |
| 10,844,083 B2 | 11/2020 | Ma et al. |

(Continued)

FOREIGN PATENT DOCUMENTS

| | | |
|---|---|---|
| CN | 105024013 A | * 11/2015 |
| JP | 2006019189 A | * 1/2006 |

(Continued)

OTHER PUBLICATIONS

Chang et al., Enhanced Stability and Performance of Air-processed Perovskite Solar Cells via Defect Passivation with a Thiazole-bridged Diketopyrrolopyrrole-based Pi-Conjugated Polymer, J. Mater. Chem. A, 2020, 8, 8593 (Year: 2020).*

(Continued)

*Primary Examiner* — Bach T Dinh
(74) *Attorney, Agent, or Firm* — Eversheds Sutherland (US) LLP

(57) ABSTRACT

Methods of passivating surfaces, composite materials, and electronic devices including the composite materials. The composite materials can include a passivated film, such as a metal halide perovskite passivated with an organic dye. The electronic devices may include solar cells.

12 Claims, 1 Drawing Sheet

(56) References Cited

U.S. PATENT DOCUMENTS

| | | | | |
|---|---|---|---|---|
| 2005/0279399 | A1* | 12/2005 | Gaudiana | C08G 65/04 |
| | | | | 528/421 |
| 2014/0264184 | A1* | 9/2014 | Arai | H10K 85/655 |
| | | | | 524/548 |
| 2017/0283693 | A1 | 10/2017 | Ma et al. | |
| 2018/0037813 | A1 | 2/2018 | Ma et al. | |
| 2019/0106325 | A1 | 4/2019 | Ma et al. | |
| 2019/0109291 | A1 | 4/2019 | Ma et al. | |
| 2019/0256535 | A1 | 8/2019 | Ma et al. | |
| 2020/0019012 | A1 | 1/2020 | Ye | |
| 2020/0270141 | A1 | 8/2020 | Gao et al. | |
| 2022/0271235 | A1* | 8/2022 | McGrath | C07D 487/22 |

FOREIGN PATENT DOCUMENTS

| | | | |
|---|---|---|---|
| JP | 2007095480 A | * | 4/2007 |
| JP | 2009302252 A | * | 12/2009 |
| JP | 2016051891 A | * | 4/2016 |

OTHER PUBLICATIONS

Chen et al., Quinacridone-Based Molecular Donors for Solution Processed Bulk-Heterojunction Organic Solar Cells, Applied Materials & Interfaces, 2010, vol. 2, No. 9, 2679-2686 (Year: 2010).*
Sytnyk et al., Hydrogen-Bonded Organic Semiconductor Micro- and Nanocrystals: From Colloidal Syntheses to (Opto-) Electronic Devices, J. Am. Chem. Soc., 2014, 136, 16522-16532 (Year: 2014).*
JP2009302252 English (Year: 2009).*
JP2016051891 English (Year: 2016).*
JP-2006019189-A English translation (Year: 2006).*
JP-2007095480-A English translation (Year: 2007).*
CN-105024013-A English translation (Year: 2015).*
Chen et al., Fully Solution Processed P-I-N Organic Solar Cells with an Industrial Pigment—Quinacridone, Organic Electronics, 2011, 12, 1126-1131 (Year: 2011).*
E.D. Glowacki et al., "Hydrogen-Bonded Semiconducting Pigments for Air-Stable Field-Effect Transistors", Adv. Mater. (2013), 25, pp. 1563-1569.
B. Scherwitzl et al., "Absorption, desorption, and film formation of quinacridone and its thermal cracking product Indigo on clean and carbon-covered silicon dioxide surfaces", J. Chem. Phys. (2016), 145, 094702 (9 pages).
Y. Zou et al., "Synthesis and Solution Processing of a Hydrogen-Bonded Ladder Polymer", Chem (2017) 2, pp. 139-152.
D. H. Apaydin et al., "Direct Electrochemical Capture and Release of Cabon Dioxide Using an Industrial Orgnaic Pigment: Quinacridone", Angew. Chem. Int. Ed. (2014) 53, pp. 6819-6822.
J. Zhao et al., "Pi-Extended Diindole-Fused Azapentacenone: Synthesis, Characterization, and Photophysical and Lithium-Storage Properties", Chem. Asian J. (2016), 11, pp. 1382-1387.
R. Wang et al., "Constructive molecular configurations for surface-defect passivation of perovskite photovoltaics", Science (2019), 366, pp. 1509-1513.
C. Chang et al., "Enhanced stability and performance of air-processed perovskite solar cells via defect passivation with a thiazole-bridged diketopyrrolopyrrole-based [pi]-conjugated polymer," Journal of Materials Chemistry A, vol. 8, No. 17, May 5, 2020, pp. 8593-8604.
J. Chen et al., "Quinacridone-Based Molecular Donors for Solution Processed Bulk-Heterojunction Organic Solar Cells", Applied Materials & Interfaces, vol. 2, No. 9, Aug. 30, 2010, pp. 2679-2686.
Q. He et al., "Highly Efficient and Stable Perovskite Solar Cells Enabled by Low-Cost Industrial Organic Pigment Coating", Angewandte Chemie International Edition, vol. 60, No. 5, Nov. 27, 2020, pp. 2485-2492.
M. Grzybowski et al., "Diketopyrrolopyrroles: Synthesis, Reactivity, and Optical Properties", Adv. Optical Mater. 2015, 3, pp. 280-320.
International Search Report and Written Opinion issued in international application No. PCT/US2022/018307, mailed May 20, 2022, 15 pages.

* cited by examiner

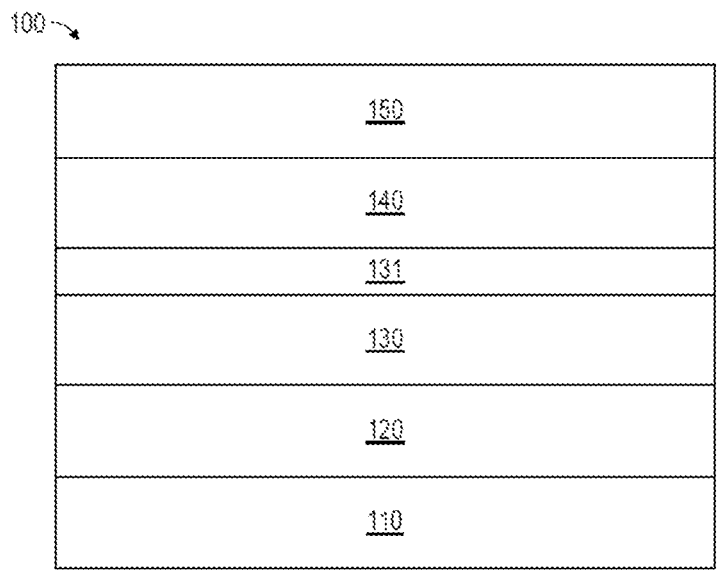

COATINGS FOR ELECTRONIC DEVICES, SOLAR CELLS, COMPOSITE MATERIALS, AND METHODS

CROSS-REFERENCE TO RELATED APPLICATIONS

This application claims priority to U.S. Provisional Patent Application No. 63/155,418 filed Mar. 2, 2021, which is incorporated herein by reference.

STATEMENT REGARDING FEDERALLY SPONSORED RESEARCH OR DEVELOPMENT

This invention was made with government support under Contract No. FA9550-18-1-0231 awarded by the Air Force Office of Scientific Research, and Contract No. 1709116 awarded by the National Science Foundation. The government has certain rights in this invention.

BACKGROUND

Perovskite solar cells (PSCs) have benefited from materials development and device engineering. For example, power conversion efficiencies (PCEs) have improved from around 4% to more than 25% for single junction devices.

However, long-term stability is one of the challenges that hinders the large scale commercialization of PSCs. Many approaches have been developed for improving the stability of PSCs, including surface passivation of halide perovskite thin films using various types of materials, such as organic halide salts, polymers, organic small molecules, low-dimensional perovskite hybrids, and inorganic compounds.

The function of surface passivation can be twofold. Surface passivation may suppress charge recombination at the interfaces between perovskite and charge transport layers, and/or increase device stability by preventing the penetration of degrading agents (e.g., $H_2O$ and $O_2$) into the perovskite layer. While various types of materials have been developed as surface passivation agents, none has satisfied the need for long-term stability.

Industrial organic pigments typically are insoluble organic compounds of high sunshine-resistant coloring strength. Common types of pigments include azo pigments, lake pigments, phthalocyanine pigments, and quinacridone pigments. Pigments, such as these, typically have very low solubility in water, organic solvents, and other various kinds of media.

There remains a need for improved passivation agents, including passivation agents that are easy to process, relatively inexpensive, stable, or a combination thereof. There also remains a need for improved methods for surface passivation.

BRIEF SUMMARY

Provided herein are composite materials, electronic devices, and methods of passivating a surface, such as a surface of a metal halide perovskite, that may be at least partially coated (e.g., passivated) with an organic dye. In some embodiments, the methods described herein include a passivation strategy that uses a relatively low-cost industrial organic pigment as a multifunctional passivation agent for halide perovskite thin films in order to achieve highly efficient and/or stable PSCs. In some embodiments, surface passivation of halide perovskite thin films with organic dyes is achieved via a facile spin-coating-annealing process, which, as described herein, may result in highly efficient and/or stable perovskite-based electronic devices, such as solar cells.

In one aspect, methods of passivating surfaces are provided. In some embodiments, the methods include providing a mixture that includes a liquid and an organic dye derivative, wherein the organic dye derivative is at least partially dissolved in the liquid; applying the mixture to a first surface of a film, wherein the film includes a metal halide perovskite; and annealing the film for a time and a temperature effective to convert the organic dye derivative to an organic dye.

In another aspect, composite materials are provided. In some embodiments, the composite materials include a film that includes a metal halide perovskite, the film having a first side and a second side opposite the first side; and a coating that includes an organic dye, wherein the coating at least partially coats the first side of the film.

In a still further aspect, electronic devices are provided. In some embodiments, the electronic devices include an electrode, a composite material as described herein, and a counter electrode, wherein the composite material is arranged between the electrode and the counter electrode. In some embodiments, the electronic devices also include a charge transport layer arranged between the composite material and the counter electrode. The electrode may contact the second side of the composite material, and the charge transport layer may contact the counter electrode and the coating of the composite material that includes an organic dye. The electronic devices may include solar cells.

Additional aspects will be set forth in part in the description which follows, and in part will be obvious from the description, or may be learned by practice of the aspects described herein. The advantages described herein may be realized and attained by means of the elements and combinations particularly pointed out in the appended claims. It is to be understood that both the foregoing general description and the following detailed description are exemplary and explanatory only and are not restrictive.

BRIEF DESCRIPTION OF THE DRAWINGS

FIG. 1 depicts an embodiment of a layer arrangement for an electronic device, such as a solar cell.

DETAILED DESCRIPTION

Provided herein are composite materials, electronic devices, and methods of passivating surfaces Methods of Passivating Surfaces Provided herein are methods of passivating surfaces. In some embodiments, the methods of passivating surfaces include providing a mixture that includes a liquid and an organic dye derivative. The mixture, in some embodiments, consists of the liquid and the organic dye derivative. The organic dye derivative may be at least partially dissolved in the liquid (i.e., all or a portion of the amount of organic dye derivative present in a mixture is dissolved in the liquid). In some embodiments, the organic dye derivative is completely dissolved in the liquid (i.e., the entire amount of organic dye derivative that is present in a mixture is dissolved in the liquid).

As used herein, the phrase "organic dye derivative" refers to a compound that (i) has a greater solubility in the liquid than an organic dye from which the organic dye derivative is derived, and (ii) is an organic dye substituted with a substituent that increases the solubility of the resulting organic dye derivative in the liquid.

In some embodiments, the organic dye derivative is very soluble (i.e., less than 1 mL of the liquid dissolves 1 g of the organic dye derivative), easily soluble (i.e., from 1 mL to 10 mL of the liquid dissolves 1 g of the organic dye derivative), soluble (i.e., from 10 mL to 30 mL of the liquid dissolves 1 g of the organic dye derivative), sparingly soluble (i.e., from 30 mL to 100 mL of the liquid dissolves 1 g of the organic dye derivative), or slightly soluble (i.e., from 100 to 1,000 mL of the liquid dissolves 1 g of the organic dye derivative) in the liquid.

In some embodiments, the organic dye is very slightly soluble (i.e., from 1,000 to 10,000 mL of the liquid dissolves 1 g of the organic dye derivative) or insoluble (i.e., more than 10,000 mL of the liquid dissolves 1 g of the organic dye derivative) in the liquid.

An organic dye derivative may be present in a mixture at any concentration. In some embodiments, an organic dye derivative is present in a mixture at a concentration of about 0.5 mg/mL to about 50 mg/mL, about 0.5 mg/mL to about 40 mg/mL, about 0.5 mg/mL to about 30 mg/mL, about 0.5 mg/mL to about 20 mg/mL, about 0.5 mg/mL to about 10 mg/mL, about 0.5 mg/mL to about 5 mg/mL, about 1 mg/mL to about 4 mg/mL, about 1.5 mg/mL to about 3 mg/mL, about 1.5 mg/mL to about 2.5 mg/mL, or about 1.8 mg/mL to about 2.2 mg/mL.

In some embodiments, the methods of passivating surfaces include applying the mixture to a first surface of a film. The mixtures may be applied to a first surface of a film using any known technique. In some embodiments, the applying of the mixture to the surface of the film includes spin-coating or drop-casting the mixture on the surface of the film.

In some embodiments, the methods include annealing the film for a time and a temperature effective to convert an organic dye derivative to an organic dye. In some embodiments, an organic dye derivative is converted to an organic dye upon removal of one or more substituents that increase the solubility of the organic dye derivative in the liquid.

The annealing may include thermal annealing, laser annealing, or a combination thereof. In some embodiments, the time effective to convert an organic dye derivative to an organic dye is about 5 minutes to about 40 minutes, about 10 minutes to about 30 minutes, about 10 minutes to about 20 minutes, or about 14 minutes to about 16 minutes. In some embodiments, the temperature effective to convert an organic dye derivative to an organic dye is about 125° C. to about 175° C., about 125° C. to about 165° C., about 135° C. to about 155° C., or about 140° C. to about 150° C.

In some embodiments, the annealing, such as laser annealing, can form insoluble microscale patterns, with phase transfer from amorphous to crystalline Therefore, the methods described herein may be used to form well-ordered layers (see Example 1).

Organic Dyes and Organic Dye Derivatives

Any known organic dye, including modified versions thereof, may be used in the methods, materials, and devices described herein.

In some embodiments, the organic dye includes indanthrene, a modified indanthrene, epindolindione, a modified epindolindione, phthalocyanine, a modified phthalocyanine, indigo, a modified indigo, isoindigo, a modified isoindigo, diketopyrrolopyrrole (DPP), a modified diketopyrrolopyrrole, a modified quinacridone, or a combination thereof.

Indigo, quinacridone, DPP, isoindigo, and epindolindione may have the following structures:

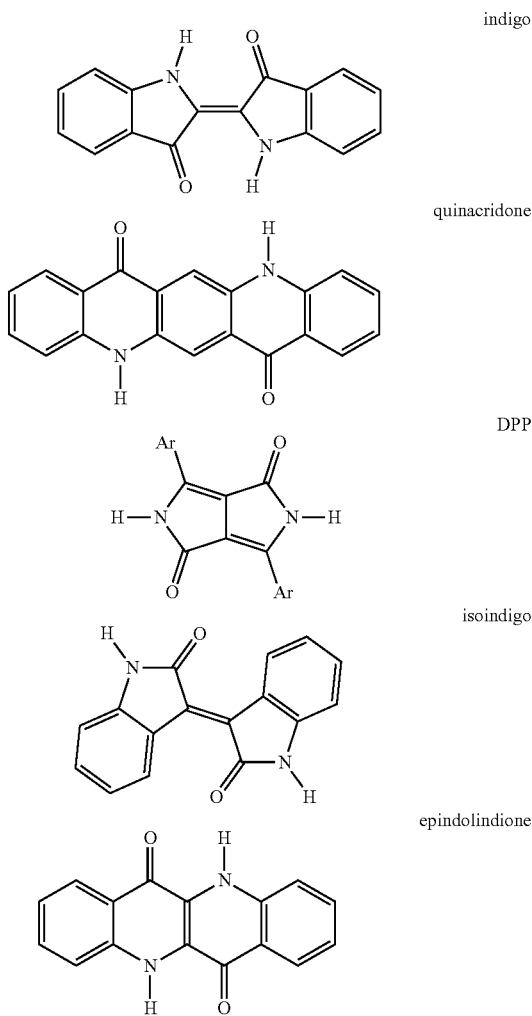

Non-limiting examples of organic dyes and organic dye derivatives are disclosed throughout the chemical literature, including Chen, J. et al. Applied Materials and Interfaces, 2010, 2, 2679-2686, and Grzybowski, M. et al. Advanced Optical Materials, 2015, 3, 280-320, which are incorporated herein by reference.

In some embodiments, the organic dye includes an electron-donating moiety and an electron-accepting moiety. The electron-donating moiety and the electron-accepting moiety may be cross-conjugated. In some embodiments, the electron-donating moiety comprises a tertiary amine, a secondary amine, or a combination thereof. In some embodiments, the electron-accepting moiety includes a carbonyl.

A "modified organic dye", such as the modified indanthrene, the modified epindolindione, the modified phthalocyanine, the modified indigo, the modified isoindigo, the modified diketopyrrolopyrrole, or the modified quinacridone, may include one or more substituents selected from a thiophene, a thiadiazole, or a combination thereof.

The one or more substituents, such as the thiophene and/or the thiadiazole, may be covalently bonded to any non-hydrogen atom of a modified organic dye, such as the modified indanthrene, the modified epindolindione, the modified phthalocyanine, the modified indigo, the modified isoindigo, the modified diketopyrrolopyrrole, or the modified quinacridone.

In some embodiments, the modified organic dye, such as the modified indanthrene, the modified epindolindione, the modified phthalocyanine, the modified indigo, the modified isoindigo, the modified diketopyrrolopyrrole, or the modified quinacridone includes one or more substituents selected from

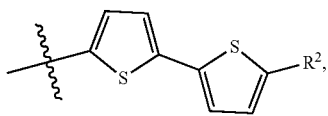
(i)

wherein each $R^2$ is independently selected from hydrogen or a $C_1$-$C_6$ hydrocarbyl;

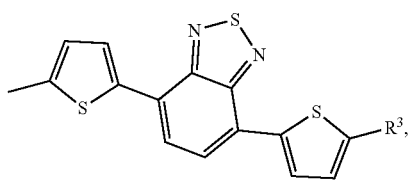
(ii)

wherein each $R^3$ is independently selected from hydrogen or a $C_1$-$C_6$ hydrocarbyl; or (iii) a combination thereof.

In some embodiments, the organic dye derivative includes an organic dye substituted with one or more solubilizing groups. As used herein, the phrase "one or more solubilizing groups" refers to substituents that impart the organic dye derivative with a solubility in the liquid that is greater than the solubility of the corresponding organic dye in the liquid.

The one or more solubilizing groups may include one or more polar moieties. The one or more polar moieties may include an ester. The one or more solubilizing groups may include one or more protecting groups. As used herein, the phase "protecting group" refers to a group that may be reversibly bonded to a functional group of a molecule. The one or more protecting groups may include any of those known in the art, including, but not limited to, 9-fluorenylmethyl carbamate (Fmoc-NRR'), t-butyl carbamate (Boc-NRR'), benzyl carbamate (Z-NRR, Cbz-NRR'), acetamide, trifluoroacetamide, phthalimide, benzylamine (Bn-NRR'), triphenylmethylamine (Tr-NRR'), benzylideneamine, p-toluenesulfonamide (Ts-NRR'), dimethyl acetyl, 1,3-dioxane, 1,3-dithiane, N,N-dimethylhydrazone, benzyl ester, 2-alkyl-1,3-oxazoline, methoxymethyl ether (MOM-OR), tetrahydropyranyl ether (THP-OR), t-butyl ether, allyl ether, benzyl ether (Bn-OR), t-butyldimethylsilyl ether (TBDMS-OR), t-butyldiphenylsilyl ether (TBDPS-OR), acetic acid ester, pivalic acid ester, benzoic acid ester, acetonide, benzylidine acetal, etc.

In some embodiments, the one or more solubilizing groups includes—

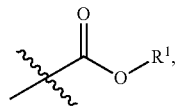

wherein each IV is independently selected from a $C_1$-$C_6$ hydrocarbyl. The $C_1$-$C_6$ hydrocarbyl may include methyl, ethyl, ispropyl, tert-butyl, etc.

In some embodiments, the organic dye is

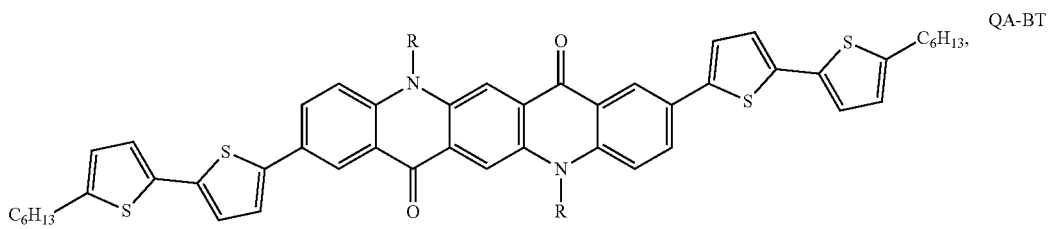
QA-BT wherein R is hydrogen;
and the organic dye derivative is—

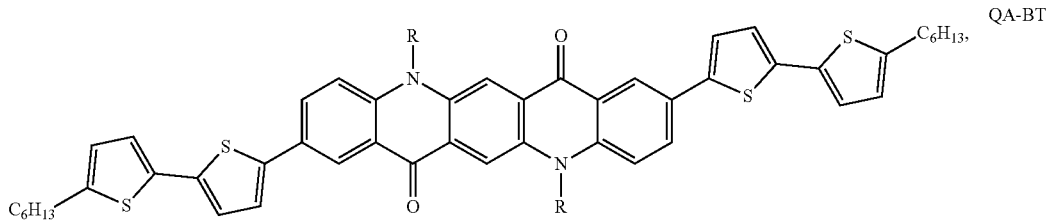
QA-BT wherein each R is independently selected from a solubilizing group, such as

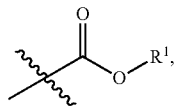   5 wherein $R^1$ is selected from a $C_1$-$C_6$ hydrocarbyl.
In some embodiments, the organic dye is—

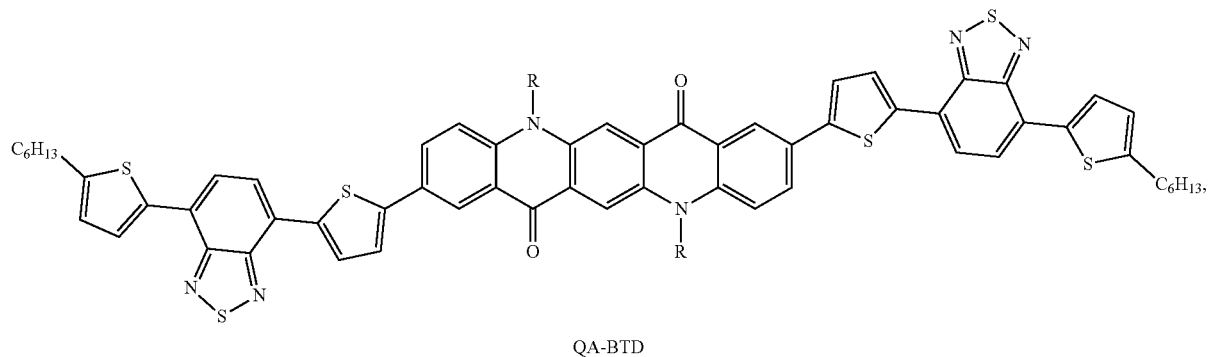

QA-BTD wherein R is hydrogen; and
the organic dye derivative is—

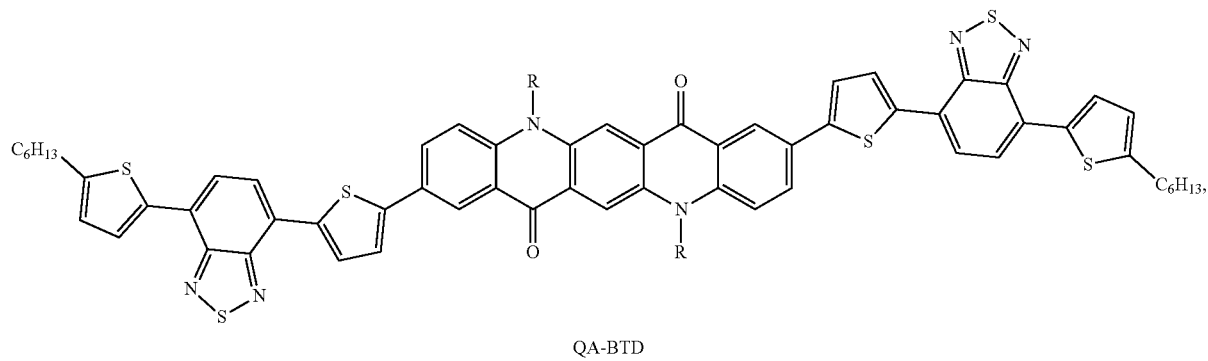

QA-BTD wherein each R is independently selected from a solubilizing group, such as

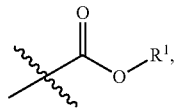   50 wherein $R^1$ is selected from a $C_1$-$C_6$ hydrocarbyl.
In some embodiments, (A) the organic dye is—

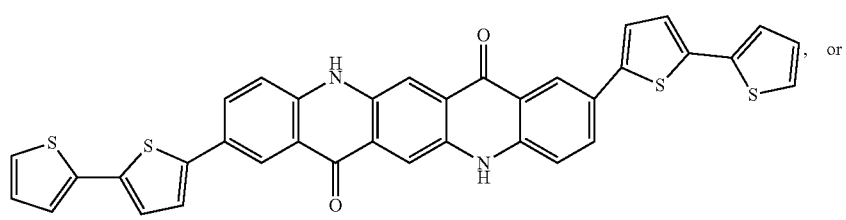, or

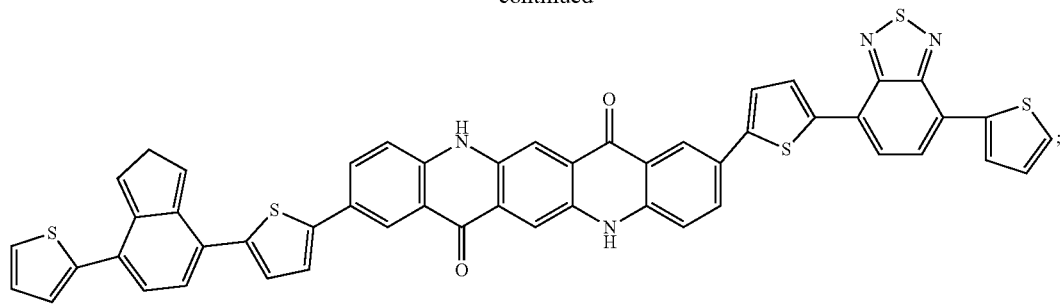

and (B) the organic dye derivative, respectively, is—

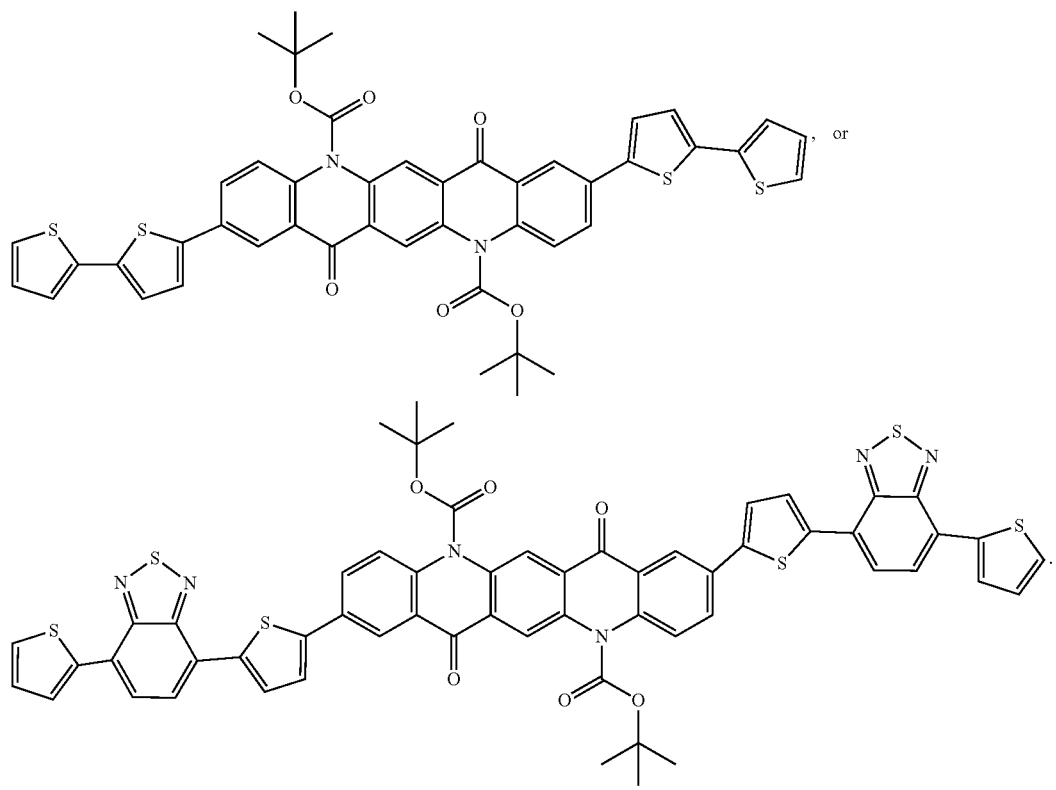

Liquids

A liquid used in the methods described herein may include any liquid in which an organic dye derivative may be at least partially dissolved.

The liquid may be an organic liquid, an aqueous liquid, or a combination thereof. The organic liquid may include an alcohol, an aryl compound, or a combination thereof. In some embodiments, the liquid includes isopropanol, chlorobenzene, or a combination thereof.

Films

The film to which a mixture is applied may include any one or more materials, such as any one or more materials that may be used in an electronic device.

The film may have any thickness or surface area. The thickness and surface area may be limited only by the intended use of the film, such as in an electronic device, as described herein.

In some embodiments, the film has a thickness of about 450 nm to about 550 nm, about 450 nm to about 525 nm, about 460 nm to about 500 nm, or about 470 nm to about 490 nm.

In some embodiments, the film includes a metal halide perovskite. In some embodiments, the film consists of a metal halide perovskite. In some embodiments, the film includes a metal halide perovskite and a matrix material. A metal halide perovskite may be dispersed in the matrix material. The matrix material may include a polymeric matrix material.

The film may include any metal halide perovskite. A metal halide perovskite may include an organic metal halide perovskite, an inorganic metal halide perovskite, or a hybrid metal halide perovskite. In some embodiments, the metal halide perovskite is a mixed halide perovskite (i.e., a metal halide perovskite containing at least two different halogen atoms (e.g., Br and I)). In some embodiments, the metal halide perovskite includes methylammonium lead iodide (MAPbI$_3$). Other non-limiting examples of metal halide perovskites are described in U.S. Patent Application Publication No. 2020/0270141, U.S. Patent Application Publication No. 2020/019012, U.S. Patent Application Publication No. 2019/0256535, U.S. Patent Application Publication No. 2019/0109291, U.S. Patent Application Publication No. 2019/0106325, U.S. Patent Application Publication No. 2018/0037813, U.S. Patent Application Publication No. 2017/0283693, U.S. Pat. Nos. 10,844,083, 10,774,032, 10,230,049, and 10,224,459, which are incorporated by reference herein.

Composite Materials

Composite materials also are provided herein. In some embodiments, the composite materials include a film that includes a metal halide perovskite. The film has a first side and a second side opposite the first side. The composite materials also include a coating that includes an organic dye, wherein the coating at least partially coats the first side of the film. In some embodiments, the coating consists of an organic dye. In some embodiments, the coating completely coats the first side of the film. The metal halide perovskite may include any of those described herein. In some embodiments, the metal halide perovskite includes methylammonium lead iodide (MAPbI$_3$).

Electronic Devices

Electronic devices also are provided herein. In some embodiments, the electronic devices include an electrode, a composite material as described herein, and a counter electrode. The composite material may be arranged between the electrode and the counter electrode. In some embodiments, the composite material is arranged between the electrode and the counter electrode, and in contact with one or both of the electrode and the counter electrode. The electrode and the counter electrode may be an anode and a cathode, respectively, or a cathode and an anode, respectively.

The electronic devices also may include one or more other layers. In some embodiments, the electronic devices also include one or more charge transport layers. The one or more charge transport layers may include a hole transport layer and/or an electron transport layer. In some embodiments, the electronic devices also include one or more charge injection layers. The one or more charge injection layers may include a hole injection layer and/or an electron injection layer.

In some embodiments, the electronic devices also include a charge transport layer arranged between a composite material and a counter electrode. In some embodiments, the electronic devices also include a charge transport layer, wherein (i) the electrode contacts the second side of the composite material, and (ii) the charge transport layer contacts the counter electrode and the coating that includes the organic dye.

The layers of the devices described herein may be formed of any suitable materials. In some embodiments, an electrode includes indium tin oxide; a charge transport layer includes 2,2',7,7'-tetrakis[N,N-di(4-methoxyphenyl)aminol-9,9'-spirobifluorene (spiro-OMeTAD); a counter electrode includes gold, or a combination thereof. One or more layers of the electronic devices, such as a charge transport layer, may be doped. The dopant may include an n-dopant or a p-dopant.

An embodiment of a layer arrangement for an electronic device is depicted at FIG. 1. The layer arrangement 100 includes a substrate 110, an electrode 120, a composite material (130, 131), a charge transport layer 140, and a counter electrode 150. The composite material is arranged between the electrode 120 and the counter electrode 150, and includes a film 130 that includes a metal halide perovskite and a coating of an organic dye 131 that completely coats a first side of the film 130. The second side of the film 130 contacts the electrode 110. The charge transport layer 140 is arranged between and in contact with both the coating of an organic dye 131 and the counter electrode 150. The substrate may include any suitable material, such as glass.

The electronic devices provided herein may include a light emitting device, such as a light emitting diode, or a photovoltaic device, i.e., a solar cell.

In some embodiments, the solar cells described herein achieve a power conversion efficiency of at least 20% (e.g., about 21%), with significantly suppressed hysteresis. Not wishing to be bound by any particular theory, it is believed that the hydrophobicity of organic dye coating layers can greatly increase the water contact angle, and improve the stability of metal halide perovskite films and devices.

In some embodiments, the electronic device is a solar cell, and the solar cell, after 240 hours of storage at 85° C., exhibits a power conversion efficiency that is equal to or greater than 80%, 85%, or 90% of an initial power conversion efficiency measured prior to storage.

In some embodiments, the electronic device is a solar cell, and the solar cell, after 1000 hours of storage at ambient conditions, exhibits a power conversion efficiency that is equal to or greater than 90%, 92%, or 95% of an initial power conversion efficiency measured prior to storage.

As used herein, the phrase "$C_1$-$C_6$ hydrocarbyl" generally refers to aliphatic groups containing from 1 to 6 carbon atoms. Examples of aliphatic groups, in each instance, include, but are not limited to, an alkyl group, a cycloalkyl group, an alkenyl group, a cycloalkenyl group, an alkynyl group, an alkadienyl group, a cyclic group, and the like, and includes all substituted, unsubstituted, branched, and linear analogs or derivatives thereof, in each instance having from 1 to about 6 carbon atoms.

Examples of alkyl groups include, but are not limited to, methyl, ethyl, propyl, isopropyl, n-butyl, t-butyl, isobutyl, pentyl, and hexyl. Example of cycloalkyl groups include, but are not limited to, cyclopropyl, cyclobutyl, cyclopentyl, and cyclohexyl. Representative alkenyl moieties include vinyl, allyl, 1-butenyl, 2-butenyl, isobutylenyl, 1-pentenyl, and 1-hexenyl. Representative alkynyl moieties include acetylenyl, propynyl, 1-butynyl, 2-butynyl, 1-pentynyl, 2-pentynyl, 3-methyl-1-butynyl, 4-pentynyl, 1-hexynyl.

Unless otherwise indicated, the term "substituted," when used to describe a chemical structure or moiety, refers to a derivative of that structure or moiety wherein one or more of its hydrogen atoms is substituted with a chemical moiety or functional group such as alcohol, alkoxy, alkanoyloxy, alkoxycarbonyl, alkenyl, alkyl (e.g., methyl), alkynyl, alkylcarbonyloxy (—OC(O)alkyl), amide (—C(O)NH-alkyl- or -alkylNHC(O)alkyl), tertiary amine (such as alkylamino, arylamino, arylalkylamino), azo, carbamoyl (—NHC(O)O-alkyl- or —OC(O)NH— alkyl), carbamyl (e.g., CONH$_2$, as well as CONH-alkyl, CONH-aryl, and CONH-arylalkyl), carboxyl, carboxylic acid, cyano, ester, ether (e.g., methoxy, ethoxy), halo, haloalkyl (e.g., —CCl$_3$, —CF$_3$, —C(CF$_3$)$_3$), heteroalkyl, isocyanate, isothiocyanate, nitrile, nitro, phosphodiester, sulfide, sulfonamido (e.g., SO$_2$NH$_2$), sulfone, sulfonyl (including alkylsulfonyl, arylsulfonyl and arylalkylsulfonyl), sulfoxide, thiol (e.g., sulfhydryl, thioether) or urea (—NHCONH-alkyl).

In the descriptions provided herein, the terms "includes," "is," "containing," "having," and "comprises" are used in an open-ended fashion, and thus should be interpreted to mean "including, but not limited to." When methods, composite material, or electronic devices are claimed or described in terms of "comprising" or "including" various elements or features, the methods, composite materials, or electronic devices can also "consist essentially of" or "consist of" the various components or features, unless stated otherwise.

The terms "a," "an," and "the" are intended to include plural alternatives, e.g., at least one. For instance, the disclosure of "a liquid," "a metal halide perovskite," "a charge transport layer", and the like, is meant to encompass one, or mixtures or combinations of more than one liquid, metal halide perovskite, charge transport layer, and the like, unless otherwise specified.

Various numerical ranges may be disclosed herein. When Applicant discloses or claims a range of any type, Applicant's intent is to disclose or claim individually each possible number that such a range could reasonably encompass, including end points of the range as well as any sub-ranges and combinations of sub-ranges encompassed therein, unless otherwise specified. Moreover, numerical end points of ranges disclosed herein are approximate. As a representative example, Applicant discloses that, in some embodiments, the time of thermal annealing is about 10 minutes to about 20 minutes. This disclosure should be interpreted as encompassing values of about 10 minutes and about 20 minutes, and further encompasses "about" each of 11 minutes, 12 minutes, 13 minutes, 14, minutes, 15 minutes, 16 minutes, 17 minutes, 18 minutes, and 19 minutes, including any ranges and sub-ranges between any of these values.

The present embodiments are illustrated herein by referring to various embodiments, which are not to be construed in any way as imposing limitations upon the scope thereof. On the contrary, it is to be understood that resort may be had to various other aspects, embodiments, modifications, and equivalents thereof which, after reading the description herein, may suggest themselves to one of ordinary skill in the art without departing from the spirit of the present embodiments or the scope of the appended claims. Thus, other aspects of the embodiments will be apparent to those skilled in the art from consideration of the specification and practice of the embodiments disclosed herein.

As used herein, the term "about" refers to values within ±5% or ±1% of the numerical value associated with the term.

EMBODIMENTS

The following listing of embodiments describes various features and combinations of features that may be present in the compositions and methods described herein:

Embodiment 1. A method of passivating a surface, the method comprising:
(A) providing a mixture comprising a liquid and an organic dye derivative, wherein the organic dye derivative is at least partially dissolved in the liquid;
applying the mixture to a first surface of film; and
annealing the film for a time and temperature effective to convert the organic dye derivative to an organic dye; or
(B) providing a mixture comprising a liquid and an organic dye derivative, wherein the organic dye derivative is dissolved in the liquid;
applying the mixture to a first surface of film; and
annealing the film for a time and temperature effective to convert the organic dye derivative to an organic dye;
(C) providing a mixture comprising a liquid and an organic dye derivative, wherein the organic dye derivative is at least partially dissolved in the liquid;
applying the mixture to a first surface of film, wherein the film comprises a metal halide perovskite; and
annealing the film for a time and temperature effective to convert the organic dye derivative to an organic dye; or
(D) providing a mixture comprising a liquid and an organic dye derivative, wherein the organic dye derivative is dissolved in the liquid;
applying the mixture to a first surface of film, wherein the film comprises a metal halide perovskite; and
annealing the film for a time and temperature effective to convert the organic dye derivative to an organic dye, wherein the organic dye is insoluble in the liquid.

Embodiment 2. The method of Embodiment 1, wherein the organic dye comprises an electron-donating moiety and an electron-accepting moiety, wherein the electron-donating moiety and the electron-accepting moiety are cross-conjugated.

Embodiment 3. The method of Embodiment 2, wherein the electron-donating moiety comprises a tertiary amine, a secondary amine, or a combination thereof.

Embodiment 4. The method of either of Embodiments 2 or 3, wherein the electron accepting moiety comprises a carbonyl.

Embodiment 5. The method of any one of Embodiments 1 to 4, wherein the organic dye comprises indanthrene, a modified indanthrene, epindolindione, a modified epindolindione, phthalocyanine, a modified phthalocyanine, indigo, a modified indigo, isoindigo, a modified isoindigo, diketopyrrolopyrrole, a modified diketopyrrolopyrrole, a modified quinacridone, or a combination thereof.

Embodiment 6. The method of Embodiment 5, wherein the modified indanthrene, the modified epindolindione, the modified phthalocyanine, the modified indigo, the modified isoindigo, the modified diketopyrrolopyrrole, or the modified quinacridone comprises one or more substituents, wherein the one or more substituents comprise a thiophene, a thiadiazole, or a combination thereof.

Embodiment 7. The method of Embodiment 6, wherein the modified indanthrene, the modified epindolindione, the modified phthalocyanine, the modified indigo, the modified isoindigo, the modified diketopyrrolopyrrole, or the modified quinacridone comprises one or more substituents selected from

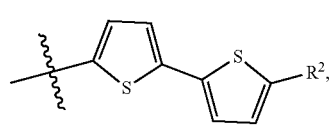

(i)

wherein each $R^2$ is independently selected from hydrogen or a $C_1$-$C_6$ hydrocarbyl;

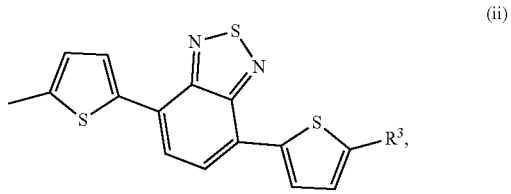

(ii)

wherein each $R^3$ is independently selected from hydrogen or a $C_1$-$C_6$ hydrocarbyl; or
(iii) a combination thereof.

Embodiment 8. The method of any one of Embodiments 1 to 7, wherein the organic dye derivative comprises the organic dye substituted with one or more solubilizing groups.

Embodiment 9. The method of Embodiment 8, wherein the one or more solubilizing groups comprises one or more polar moieties.

Embodiment 10. The method of Embodiment 9, wherein the one or more polar moieties comprises an ester.

Embodiment 11. The method of Embodiment 8, wherein the one or more solubilizing groups comprises one or more protecting groups, such as 9-fluorenylmethyl carbamate (Fmoc-NRR'), t-Butyl carbamate (Boc-NRR), benzyl carbamate (Z-NRR, Cbz-NRR), acetamide, trifluoroacetamide, phthalimide, benzylamine (Bn-NRR'), triphenylmethylamine (Tr-NRR'), benzylideneamine, p-toluenesulfonamide (Ts-NRR'), dimethyl acetyl, 1,3-dioxane, 1,3-dithiane, N,N-dimethylhydrazone, benzyl ester, 2-alkyl-1,3-oxazoline, methoxymethyl ether (MOM-OR), tetrahydropyranyl ether (THP-OR), t-butyl ether, allyl ether, benzyl ether (Bn-OR), t-butyldimethylsilyl ether (TBDMS-OR), t-butyldiphenylsilyl ether (TBDPS-OR), acetic acid ester, pivalic acid ester, benzoic acid ester, or acetonide, benzylidine acetal.

Embodiment 12. The method of claim 8, wherein the one or more solubilizing groups comprises—

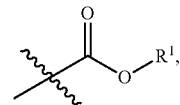

wherein each $R^1$ is independently selected from a $C_1$-$C_6$ hydrocarbyl.

Embodiment 12. The method of any one of the preceding Embodiments, wherein—
(A) the organic dye is

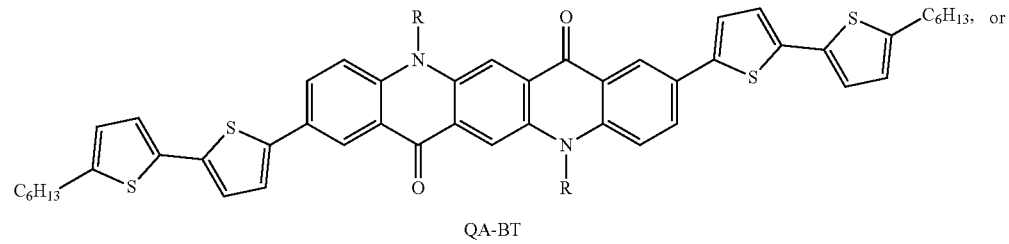

QA-BT

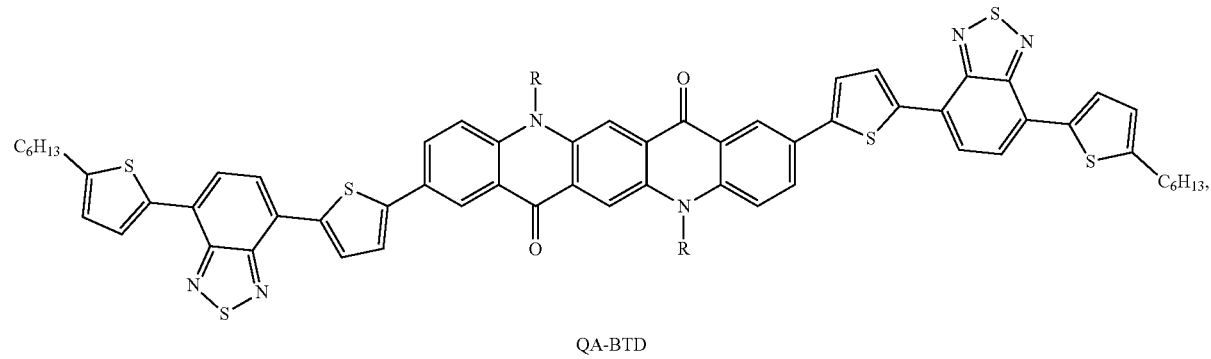

QA-BTD wherein R is hydrogen; and
(B) the organic dye derivative, respectively, is—

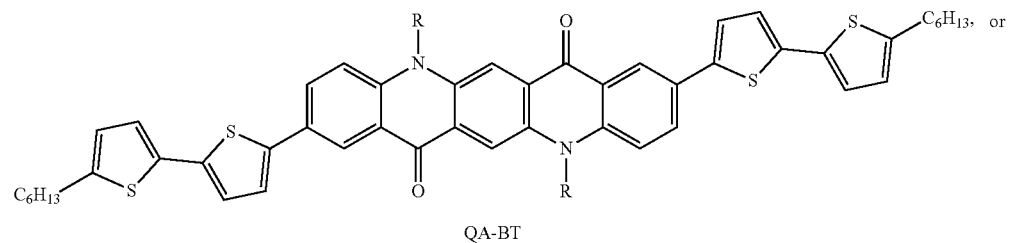

QA-BT

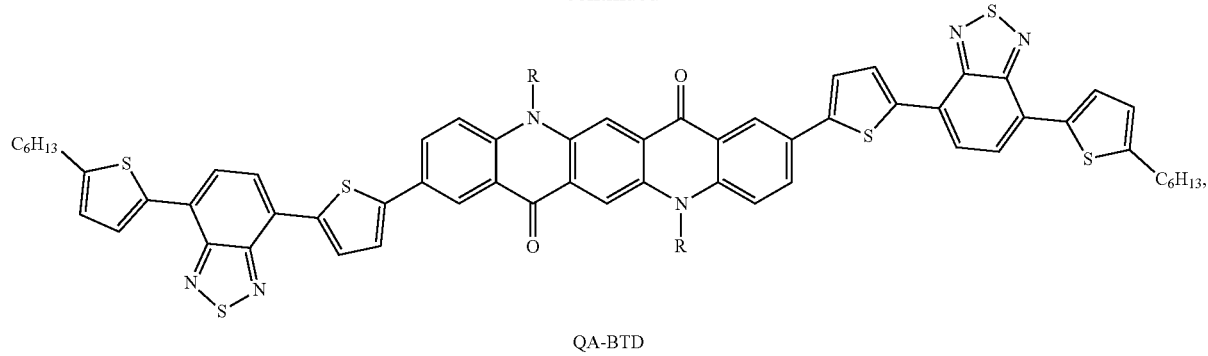
QA-BTD
wherein each R is independently selected from
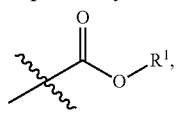
wherein each $R^1$ is independently selected from a $C_1$-$C_6$ hydrocarbyl.
Embodiment 14. The method of any one of claims 1 to 12, wherein—
(A) the organic dye is—
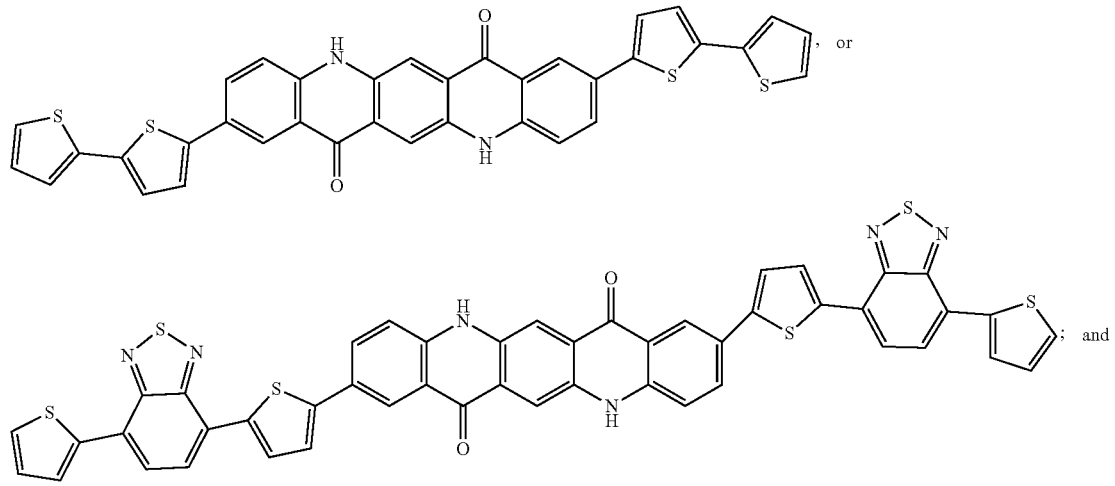
(B) the organic dye derivative, respectively, is—
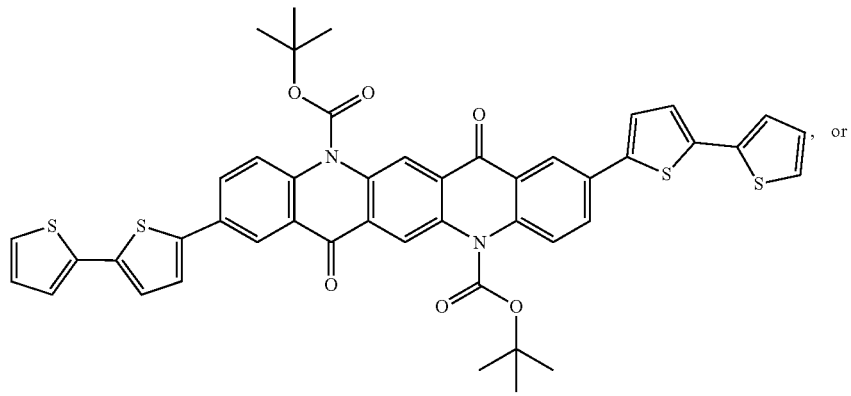

-continued

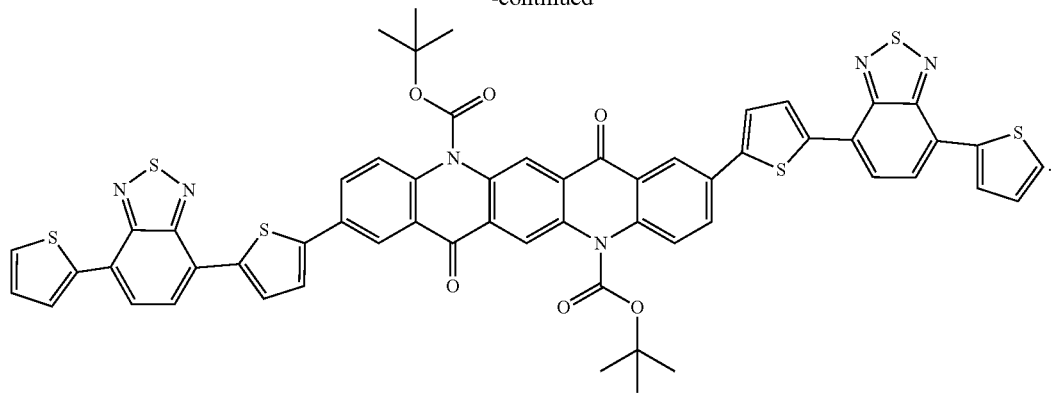

Embodiment 15. The method of any one of the preceding Embodiments, wherein the applying of the mixture to the surface of the film comprises spin-coating the mixture to the surface of the film.

Embodiment 16. The method of any one of the preceding Embodiments, wherein the film comprises a metal halide perovskite and a matrix material.

Embodiment 17. The method of any one of the preceding Embodiments, wherein the metal halide perovskite is dispersed in the matrix material.

Embodiment 18. The method of either of Embodiments 16 or 17, wherein the matrix material is a polymeric matrix material.

Embodiment 19. The method of any one of the proceeding Embodiments, wherein the metal halide perovskite is an organic metal halide perovskite.

Embodiment 20. The method of any one of Embodiments 1 to 18, wherein the metal halide perovskite is an inorganic metal halide perovskite.

Embodiment 21. The method of any one of Embodiments 1 to 18, wherein the metal halide perovskite is a hybrid metal halide perovskite.

Embodiment 22. The method of any one of Embodiments 1 to 18, wherein the metal halide perovskite is a mixed metal halide perovskite.

Embodiment 23. The method of any one of Embodiments 1 to 18, wherein the metal halide perovskite comprises methylammonium lead iodide ($MAPbI_3$).

Embodiment 24. The method of any one of the preceding Embodiments, wherein the liquid comprises (i) an organic liquid, such as an alcohol or aryl organic compound, (ii) an aqueous liquid, or (iii) a combination of an organic liquid and an aqueous liquid, wherein the organic liquid is optionally selected from isopropanol, chlorobenzene, or a combination thereof.

Embodiment 25. The method of any one of the preceding Embodiments, wherein a concentration of the organic dye derivative in the mixture is about 1.5 mg/mL to about 50 mg/mL, about 1.5 mg/mL to about 40 mg/mL, about 1.5 mg/mL to about 30 mg/mL, about 1.5 mg/mL to about 20 mg/mL, about 1.5 mg/mL to about 10 mg/mL, or about 1.5 mg/mL to about 2.5 mg/mL.

Embodiment 26. The method of any one of Embodiments 1 to 24, wherein a concentration of the organic dye derivative in the mixture is about 0.5 mg/mL to about 5 mg/mL.

Embodiment 27. The method of any one of Embodiments 1 to 24, wherein a concentration of the organic dye derivative in the mixture is about 1 mg/mL to about 4 mg/mL.

Embodiment 28. The method of any one of Embodiments 1 to 24, wherein a concentration of the organic dye derivative in the mixture is about 1.5 mg/mL to about 3 mg/mL.

Embodiment 29. The method of any one of Embodiments 1 to 24, wherein a concentration of the organic dye derivative in the mixture is about 1.8 mg/mL to about 2.2 mg/mL.

Embodiment 30. The method of any one of the preceding Embodiments, wherein the annealing comprises laser annealing, thermal annealing, or a combination thereof.

Embodiment 31. The method of any one of the preceding Embodiments, wherein the film is annealed for a time and temperature effective to convert the organic dye derivative to an organic dye.

Embodiment 32. The method of any one of the preceding Embodiments, wherein the annealing comprises forming one or more insoluble microscale patterns or the organic dye.

Embodiment 33. The method of either of Embodiments 30 or 31, wherein the annealing time is about 5 minutes to about 50 minutes, or about 10 minutes to about 30 minutes.

Embodiment 34. The method of either of Embodiments 30 or 31, wherein the annealing time is about 10 minutes to about 20 minutes.

Embodiment 35. The method of either of Embodiments 30 or 31, wherein the annealing time is about 14 minutes to about 16 minutes.

Embodiment 36. The method of any of Embodiments 30 to 35, wherein the annealing temperature is about 125° C. to about 175° C.

Embodiment 37. The method of any one of Embodiments 30 to 35, wherein the annealing temperature is about 125° C. to about 165° C.

Embodiment 38. The method of any one of Embodiments 30 to 35, wherein the annealing temperature is about 135° C. to about 155° C. or about 140° C. to about 150° C.

Embodiment 39. The method of any one of Embodiments 30 to 35, wherein—
(A) the organic dye derivative is very soluble (i.e., less than 1 mL of the liquid dissolves 1 g of the organic dye derivative), easily soluble (i.e., from 1 mL to 10 mL of the liquid dissolves 1 g of the organic dye derivative), soluble (i.e., from 10 mL to 30 mL of the liquid dissolves 1 g of the organic dye derivative), sparingly soluble (i.e., from 30 mL to 100 mL of the liquid dissolves 1 g of the organic dye derivative), or slightly soluble (i.e., from 100 to 1,000 mL of the liquid dissolves 1 g of the organic dye derivative) in the liquid, and/or (B) the organic dye is very slightly soluble (i.e., from 1,000 to 10,000 mL of the liquid dissolves 1 g of the organic dye derivative) or insoluble (i.e., more than 10,000 mL of the liquid dissolves 1 g of the organic dye derivative) in the liquid.

Embodiment 40. A composite material comprising a film comprising a metal halide perovskite, the film having a first side and a second side opposite the first side and a coating comprising an organic dye, wherein the coating at least partially coats the first side of the film.

Embodiment 41. The composite material of Embodiment 40, wherein the film comprises a metal halide perovskite and a matrix material.

Embodiment 42. The composite material of Embodiment 41, wherein the metal halide perovskite is dispersed in the matrix material.

Embodiment 43. The composite material of either of Embodiments 41 or 42, wherein the matrix material is a polymeric matrix material.

Embodiment 44. The composite material of any one of Embodiments 40 to 43, wherein the metal halide perovskite is an organic metal halide perovskite.

Embodiment 45. The composite material of any one of Embodiments 40 to 43, wherein the metal halide perovskite is an inorganic metal halide perovskite.

Embodiment 46. The composite material of any one of Embodiments 40 to 43, wherein the metal halide perovskite is a hybrid metal halide perovskite.

Embodiment 47. The composite material of any one of Embodiments 40 to 43, wherein the metal halide perovskite is a mixed metal halide perovskite.

Embodiment 48. The composite material of any one of Embodiment 40 to 43, wherein the metal halide perovskite comprises methylammonium lead iodide ($MAPbI_3$).

Embodiment 49. The composite material of any one of Embodiments 40 to 48, wherein the film has a thickness of about 460 nm to about 500 nm.

Embodiment 50. The composite material of any one of Embodiments 40 to 48, wherein film has a thickness of about 450 nm to about 550 nm.

Embodiment 51. The composite material of any one of Embodiments 40 to 48, wherein the film has a thickness of about 450 nm to about 525 nm.

Embodiment 52. The composite material of any one of Embodiments 40 to 48, wherein the film has a thickness of about 470 nm to about 490 nm.

Embodiment 53. The composite material of any one of Embodiments 40 to 52, wherein the coating completely coats the first side of the film.

Embodiment 54. An electronic device comprising an electrode; the composite material of any one of Embodiments 40 to 53; and a counter electrode, wherein the composite material is arranged between the electrode and the counter electrode.

Embodiment 55. The electronic device of Embodiment 54, further comprising a charge transport layer arranged between the composite material and the counter electrode.

Embodiment 56. The electronic device of either of Embodiments 54 or 55, wherein (i) the electrode contacts the second side of the composite material, and (ii) the charge transport layer contacts (a) the counter electrode and (b) the coating comprising the organic dye.

Embodiment 57. The electronic device of any one of Embodiments 54 to 56, wherein the electrode comprises indium tin oxide; the charge transport layer comprises 2,2',7,7'-tetrakis[N,N-di(4-methoxyphenyl)amino]-9,9'-spirobifluorene (spiro-OMeTAD); and the counter electrode comprises gold.

Embodiment 58. The electronic device of any one of Embodiments 54 to 57, wherein the charge transport layer is a hole transport layer.

Embodiment 59. The electronic device of any one of Embodiments 54 to 58, wherein the electronic device is a solar cell.

Embodiment 60. The electronic device of any one of Embodiments 54 to 59, wherein the solar cell, after 240 hours of storage at 85° C., exhibits a power conversion efficiency that is equal to or greater than 80% of an initial power conversion efficiency measured prior to storage.

Embodiment 61. The electronic device of any one of Embodiments 54 to 59, wherein the solar cell, after 240 hours of storage at 85° C., exhibits a power conversion efficiency that is equal to or greater than 85% of an initial power conversion efficiency measured prior to storage.

Embodiment 62. The electronic device of any one of Embodiments 54 to 59, wherein the solar cell, after 240 hours of storage at 85° C., exhibits a power conversion efficiency that is equal to or greater than 90% of an initial power conversion efficiency measured prior to storage.

Embodiment 63. The electronic device of any one of Embodiments 54 to 62, wherein the solar cell, after 1000 hours of storage at ambient conditions, exhibits a power conversion efficiency that is equal to or greater than 90% of an initial power conversion efficiency measured prior to storage.

Embodiment 64. The electronic device of any one of Embodiments 54 to 62, wherein the solar cell, after 1000 hours of storage at ambient conditions, exhibits a power conversion efficiency that is equal to or greater than 92% of an initial power conversion efficiency measured prior to storage.

Embodiment 65. The electronic device of any one of Embodiments 54 to 62, wherein the solar cell, after 1000 hours of storage at ambient conditions, exhibits a power conversion efficiency that is equal to or greater than 95% of an initial power conversion efficiency measured prior to storage.

Embodiment 66. A compound of any one of Embodiments 1 to 13.

EXAMPLES

The present invention is further illustrated by the following examples, which are not to be construed in any way as imposing limitations upon the scope thereof. On the contrary, it is to be clearly understood that resort may be had to various other aspects, embodiments, modifications, and equivalents thereof which, after reading the description herein, may suggest themselves to one of ordinary skill in the art without departing from the spirit of the present invention or the scope of the appended claims. Thus, other aspects of this invention will be apparent to those skilled in the art from consideration of the specification and practice of the invention disclosed herein.

Example 1—Passivation of Films

Halide perovskite thin films coated by an organic dye are produced in this example by depositing t-BOC QA-BT and t-BOC QA-BTD on top of perovskite thin films, and using thermal annealing and/or laser annealing to remove t-BOC groups.

The films are prepared with a two-step sequential spin-coating process. To enable surface passivate halide perovskite thin films via solution processing, t-BOC QA-BT and t-BOC QA-BTD are synthesized based on known procedures (see, e.g., Chen, T. L.; Chen, J. J. A.; Catane, L.; Ma, B. W. Fully solution processed p-i-n organic solar cells with an industrial pigment—Quinacridone. *Org Electron* 2011, 12, 1126-1131).

A t-BOC QA-BT or t-BOC QA-BTD solution in isopropanol is spin-coated on halide perovskite thin films to prepare t-BOC QA-BT and t-BOC QA-BTD coated halide perovskite thin films, followed by thermal annealing at 145° C. for 15 minutes to convert t-BOC QA-BT and t-BOC QA-BTD into insoluble QA-BT and QA-BTD, respectively.

The generation of polycrystalline pigment layers are confirmed by the change of absorption spectra, which may be attributed to the NH•••O hydrogen-bonding and molecular stacking effects of QA-BT and QA-BTD. The thickness of QA-BT and QA-BTD on top of halide perovskite thin films is controlled by the solution concentration of the solutions as well as spin-casting conditions. The QA-BT and QA-BTD coated halide perovskite thin films are fully characterized and utilized for the fabrication of PSCs.

QA-BT and QA-BTD can effectively passivate the defects of halide perovskite thin films through Lewis base-acid interactions between C=O groups and the antisite Pb sites (for instance, in MAPbI$_3$ and PbI$_2$). Moreover, the insoluble QA-BT and QA-BTD layer can significantly increase the water contact angle of surface passivated halide perovskite thin films, and greatly improve the stability of halide perovskite thin films and PSCs.

Besides thermal annealing, other methods are used to convert soluble functionalized organic pigments to insoluble pristine ones. Laser annealing, as an alternative hot-plate thermal annealing process, uses pulsed lasers for rapid heating of the targets (see, e.g., Schneller, E.; Dhere, N. G.; Kar, A. Overview of Laser Processing in Solar Cell Fabrication. *Laser Processing and Fabrication for Solar, Displays, and Optoelectronic Devices Iii* 2014, 9180; Gupta, M. C.; Carlson, D. E. Laser processing of materials for renewable energy applications. *Mrs Energy Sustain* 2015, 2; and You, P.; Li, G. J.; Tang, G. Q.; Cao, J. P.; Yan, F. Ultrafast laser-annealing of perovskite films for efficient perovskite solar cells. *Energ Environ Sci* 2020, 13, 1187-1196).

As a non-contact method of energy transfer in a controlled way, laser annealing can possess a number of advantages of i) localized heating (minimized thermal impact on substrate), ii) scalability (large area), iii) nanostructure controllability and iv) highly automated and streamlined fabrication. These unique features of laser processing may permit large volume cost-efficient roll-to-roll manufacturing.

Laser annealing, both solid phase and melt-mediated, provides control on crystallinity and morphology of the annealed thin films. Laser annealing can play an important role in silicon solar cells manufacturing processes and have been used for processing of nanocrystalline titanium dioxide films for dye sensitized solar cells. Laser annealing is used in the methods described herein to form organic semiconductors thin films. Laser annealing can cause the formation of insoluble microscale patterns with phase transfer from amorphous to crystalline.

Developed in this example are new solution processable organic pigment-related semiconducting materials containing thermally removable solubilizing groups. Of interest are π-conjugated molecules with tunable bandgaps, for instance, quinacridone (QA) derivatives. Examples of relevant QA derivatives include, but are not limited to, t-Boc QA, t-Boc QA-BT, and t-Boc QA-BTD.

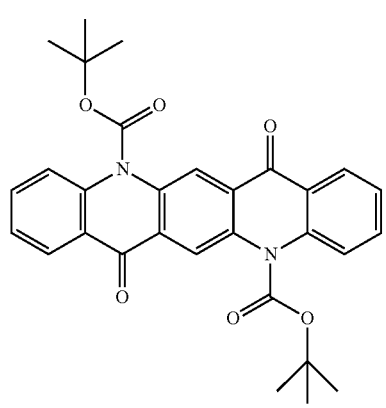

t-Boc QA

-continued

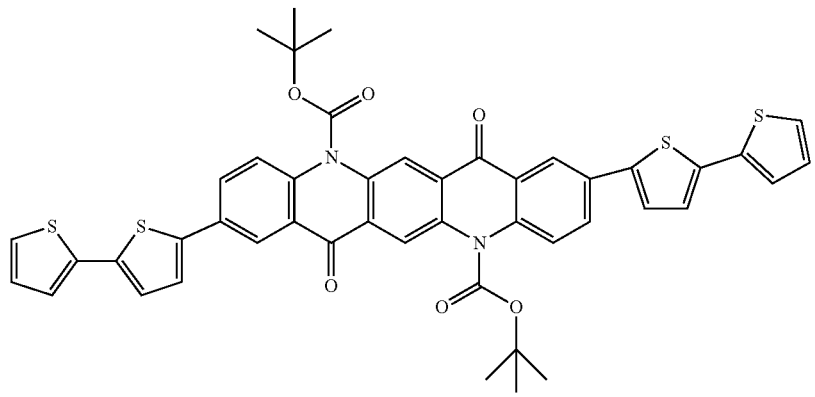

t-Boc QA-BT

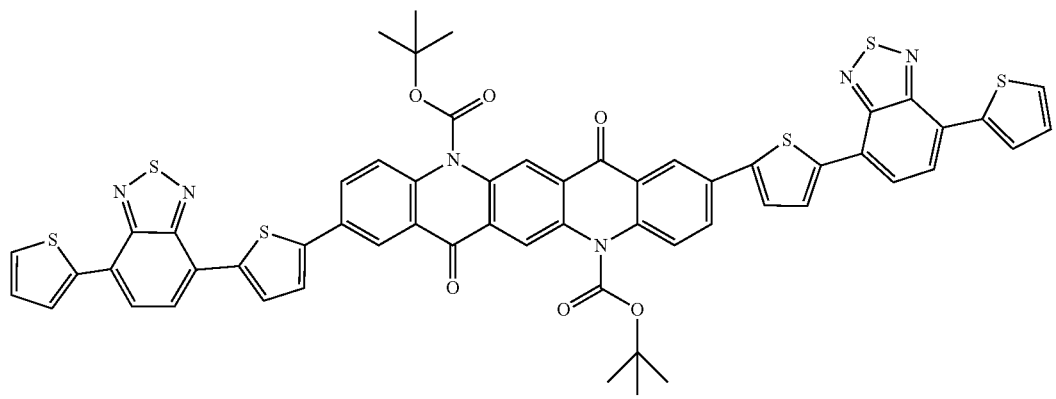

t-Boc QA-BTD

These QA derivatives possess tunable electronic structures, each having unique highest occupied molecular orbital (HOMO) and lowest unoccupied molecular orbital (LUMO) energy levels. Specifically, t-Boc QA has HOMO and LUMO energy levels of 5.8 eV and 3.27 eV respectively, t-BOC QA-BT has HOMO and LUMO energy levels 5.64 eV and 3.34 eV respectively, and t-BOC QA-BTD has HOMO and LUMO energy levels 5.55 eV and 3.42 eV respectively.

Moreover, these QA derivatives were capable of self-assembly to form well-ordered, insoluble structures during the thermolysis processes. In this embodiment, the soluble organic pigment (t-BOC QA-BT) is thermally annealed, such that the result is an insoluble, well-ordered organic thin film, which included QA-BT.

To compare their performance with QA, thermal annealing treatments will be utilized to convert them into insoluble thin films. Moreover, the use of combined treatment methods, e.g. simultaneous laser/thermal annealing, achieves optimal thin film properties.

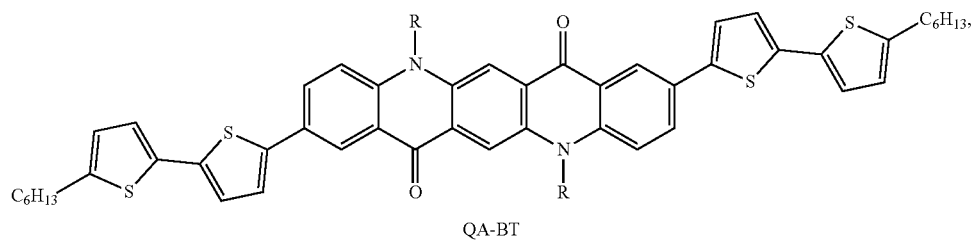

QA-BT wherein each R is independently selected from
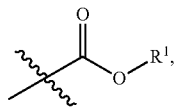
wherein each $R^1$ is independently selected from a $C_1$-$C_6$ hydrocarbyl.
10. The method of claim 1, wherein—
(A) the organic dye is
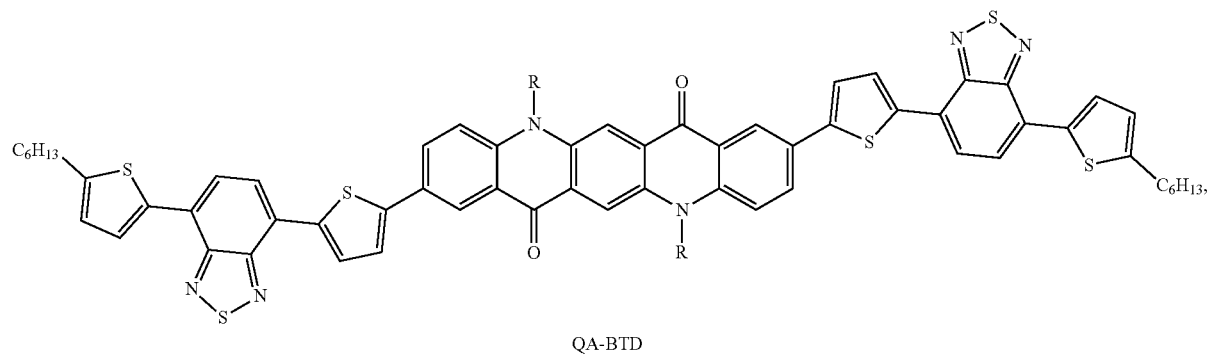
QA-BTD
wherein R is hydrogen; and
(B) the organic dye derivative is—
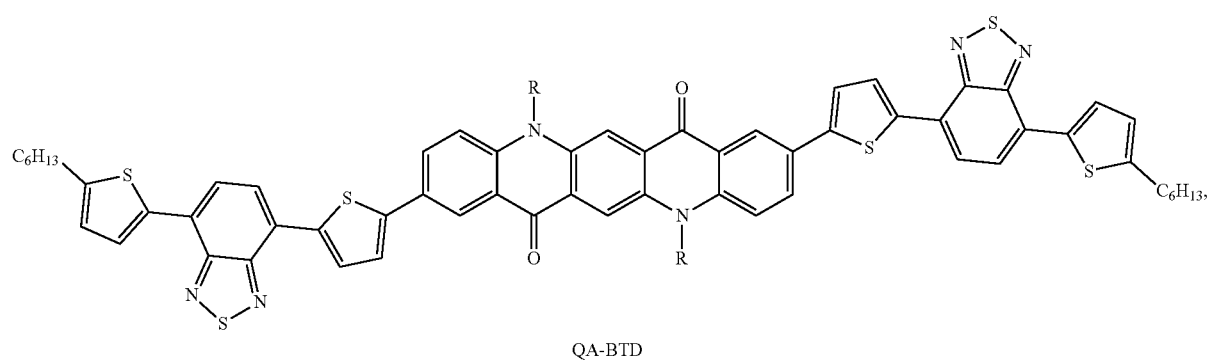
QA-BTD wherein each R is independently selected from
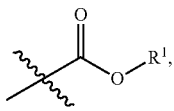
wherein each $R^1$ is independently selected from a $C_1$-$C_6$ hydrocarbyl.
11. The method of claim 1, wherein—
(A) the organic dye is—
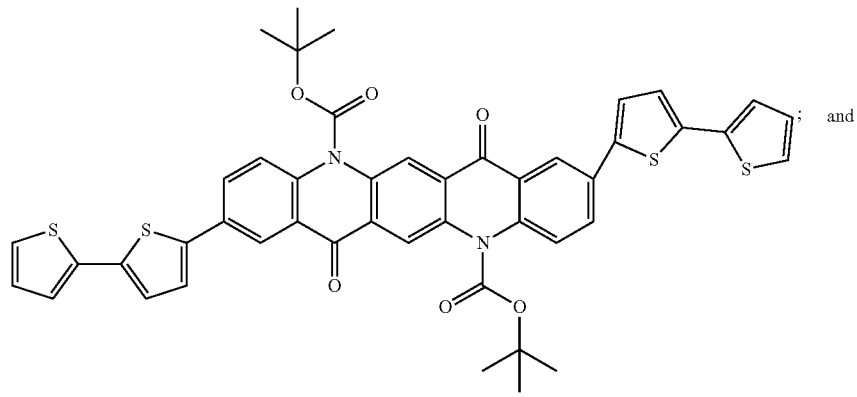 [SMILES: CC(C)(C)OC(=O)n1c2ccc(-c3ccc(-c4cccs4)s3)cc2c(=O)c2cc3c(cc21)c(=O)c1cc(-c2ccc(-c4cccs4)s2)ccc1n3C(=O)OC(C)(C)C]
and
(B) the organic dye derivative is—
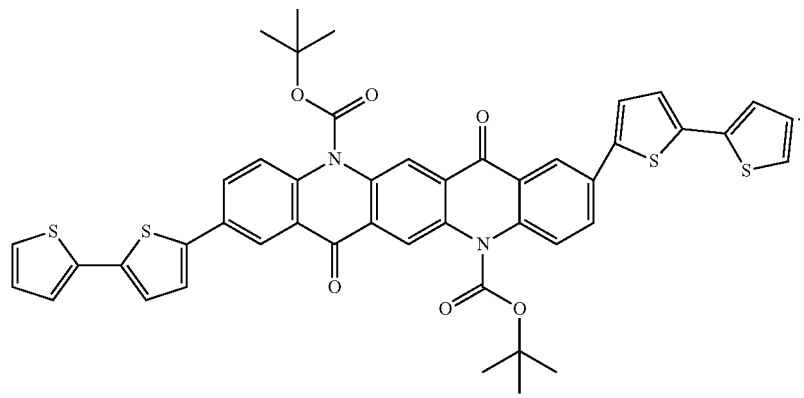 [SMILES: CC(C)(C)OC(=O)n1c2ccc(-c3ccc(-c4cccs4)s3)cc2c(=O)c2cc3c(cc21)c(=O)c1cc(-c2ccc(-c4cccs4)s2)ccc1n3C(=O)OC(C)(C)C]
12. The method of claim 1, wherein—
(A) the organic dye is—
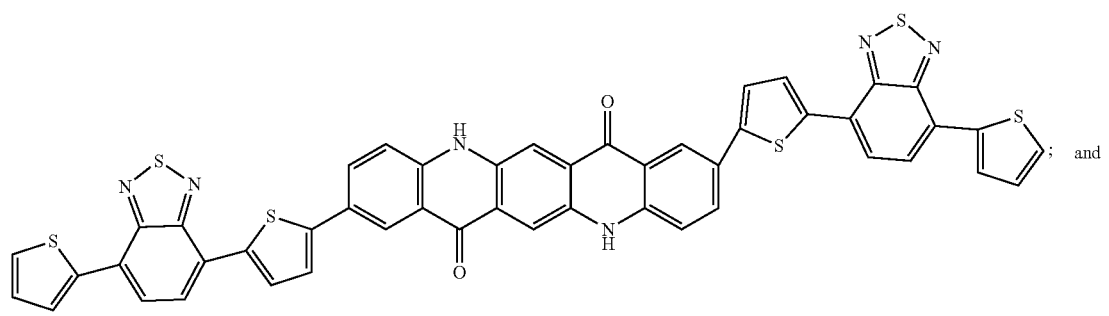 [SMILES: O=c1c2cc(-c3ccc(-c4ccc(-c5cccs5)c5nsnc45)s3)ccc2[nH]c2cc3c(=O)c4cc(-c5ccc(-c6ccc(-c7cccs7)c7nsnc67)s5)ccc4[nH]c3cc12]
and (B) the organic dye derivative is—
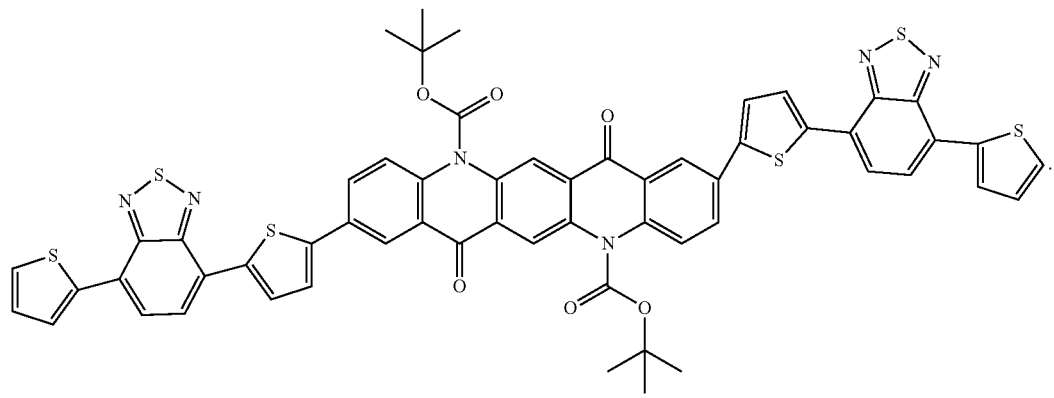

What is claimed is:

1. A method of passivating a surface, the method comprising:
    providing a mixture comprising a liquid and an organic dye derivative, wherein the organic dye derivative is at least partially dissolved in the liquid;
    applying the mixture to a first surface of a film, wherein the film comprises a metal halide perovskite; and
    annealing the film for a time and a temperature effective to convert the organic dye derivative to an organic dye;

wherein—

(A) the organic dye is

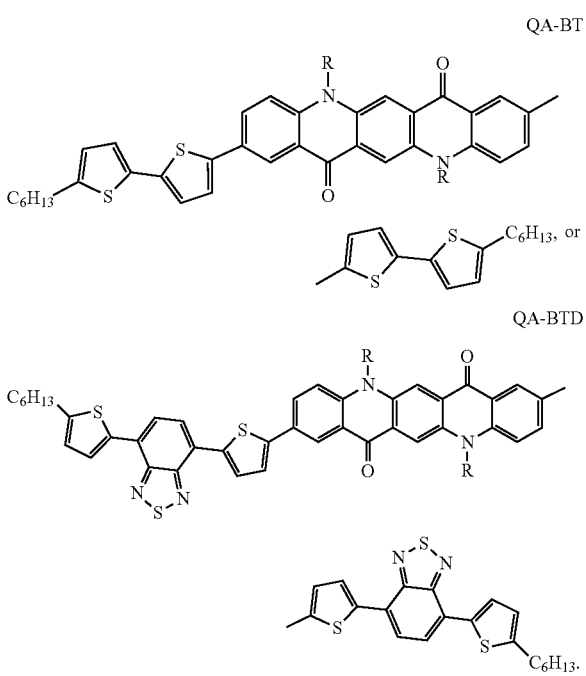

QA-BT

QA-BTD wherein R is hydrogen; and
(B) the organic dye derivative, respectively, is—
QA-BT
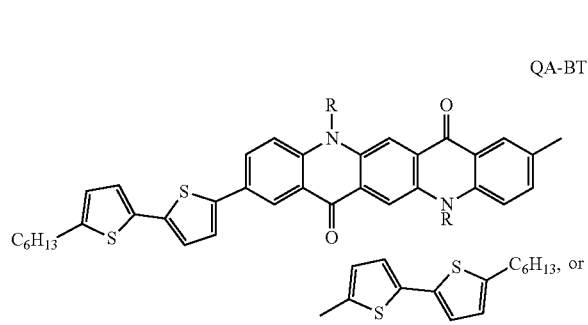
QA-BTD
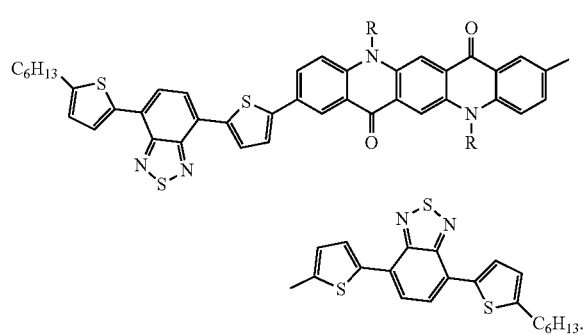
wherein each R is independently selected from
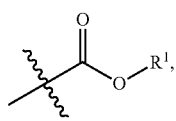
wherein each $R^1$ is independently selected from a $C_1$-$C_6$ hydrocarbyl; or
wherein—
(1) the organic dye is—
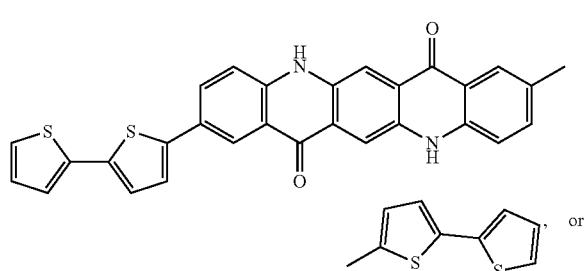
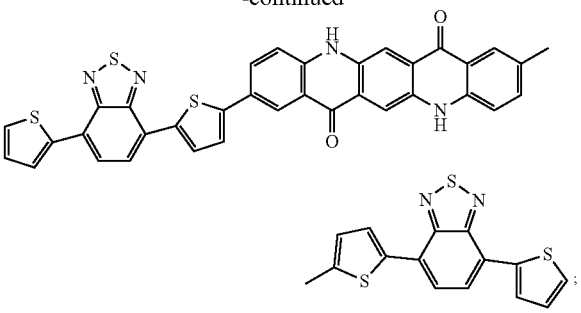
and
(2) the organic dye derivative, respectively, is—
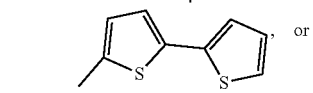
2. The method of claim 1, wherein—
(A) the organic dye is
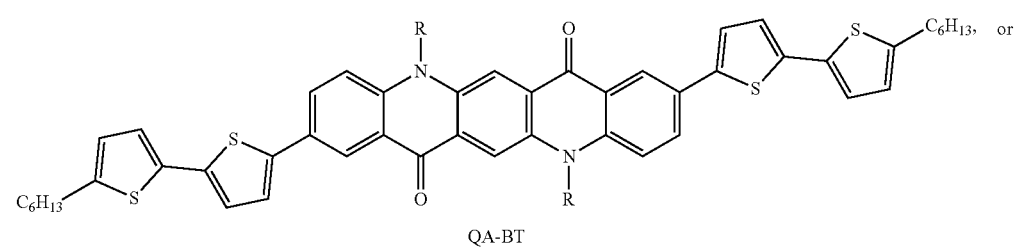
QA-BT

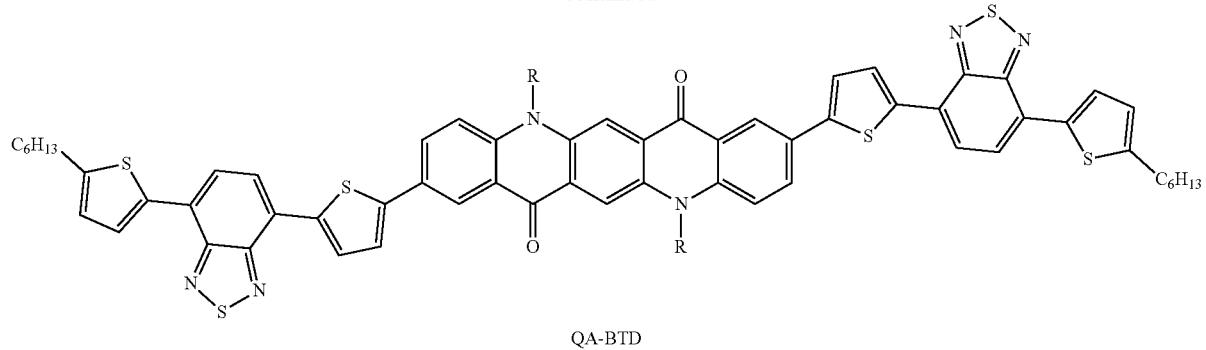
QA-BTD
wherein R is hydrogen; and
(B) the organic dye derivative, respectively, is—
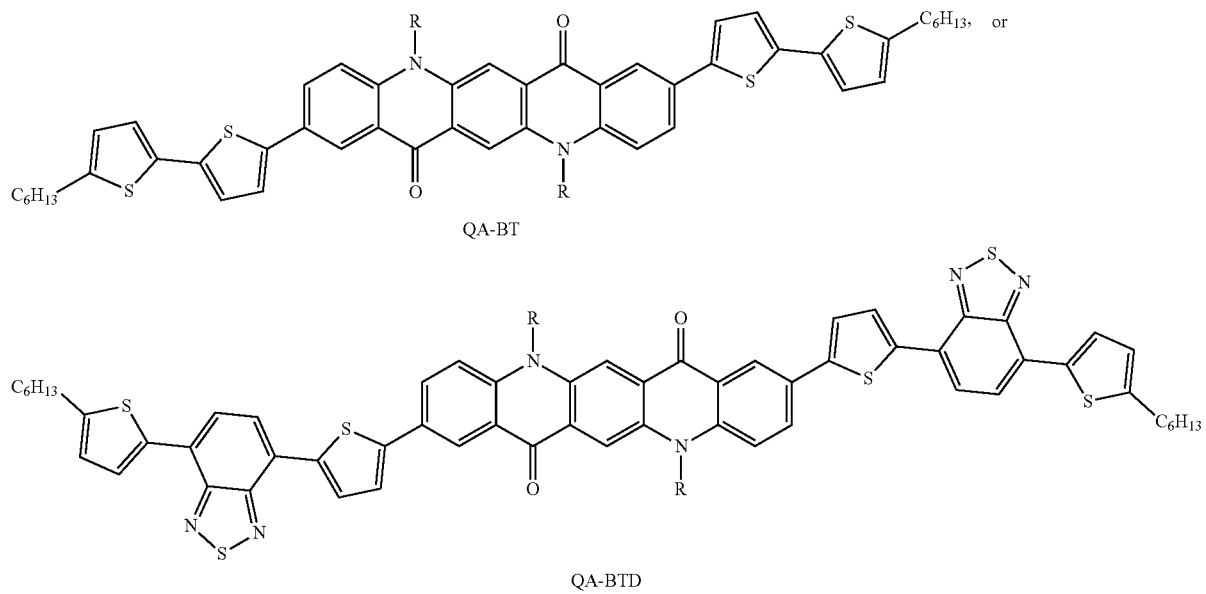
QA-BT
QA-BTD
wherein each R is independently selected from
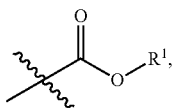
wherein each $R^1$ is independently selected from a $C_1$-$C_6$ hydrocarbyl.
3. The method of claim 1, wherein—
(A) the organic dye is—
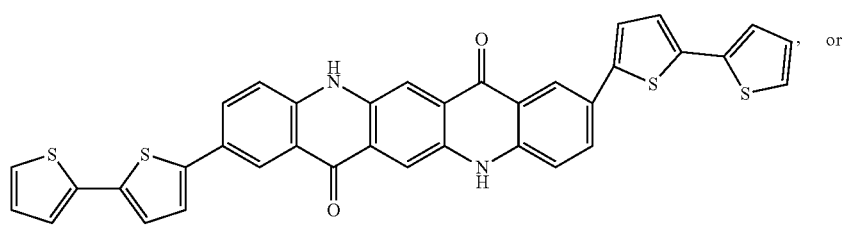

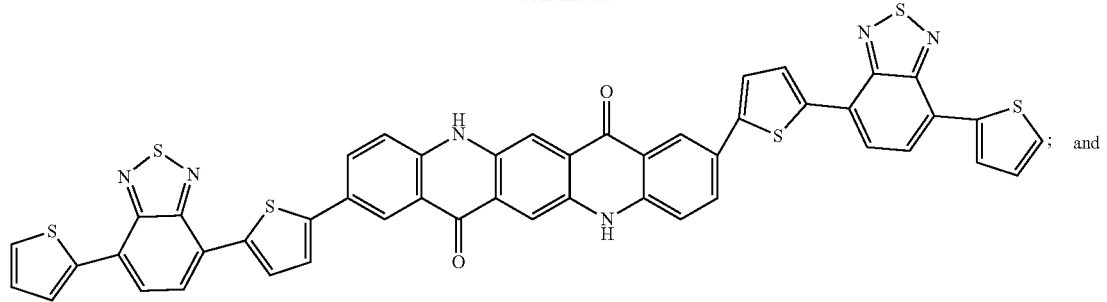
; and
(B) the organic dye derivative, respectively, is—
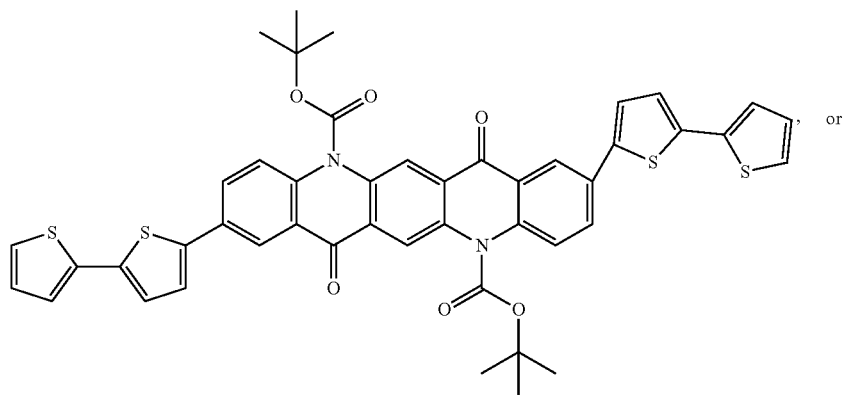
, or
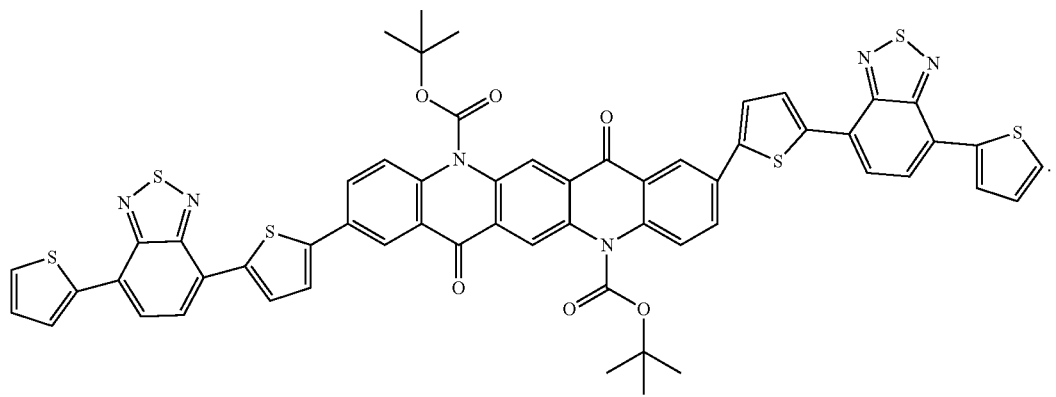 [SMILES: CC(C)(C)OC(=O)n1c2ccc(-c3ccc(-c4ccc(-c5cccs5)c5nsnc45)s3)cc2c(=O)c2cc3c(cc21)c(=O)c1cc(-c2ccc(-c4ccc(-c5cccs5)c5nsnc45)s2)ccc1n3C(=O)OC(C)(C)C]
.

4. The method of claim 1, wherein the applying of the mixture to the surface of the film comprises spin-coating the mixture to the surface of the film.

5. The method of claim 1, wherein the metal halide perovskite comprises methylammonium lead iodide ($MAPbI_3$).

6. The method of claim 1, wherein the liquid comprises isopropanol, chlorobenzene, or a combination thereof.

7. The method of claim 1, wherein a concentration of the organic dye derivative in the mixture is about 1.5 mg/mL to about 2.5 mg/mL.

8. The method of claim 1, wherein the annealing comprises laser annealing, thermal annealing, or a combination thereof.

9. The method of claim 1, wherein—
(A) the organic dye is

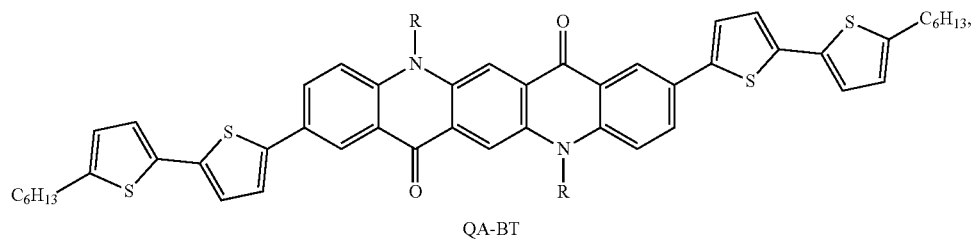

QA-BT wherein R is hydrogen; and
(B) the organic dye derivative is—